Oct. 15, 1963 R. J. ORWIN 3,107,333

REGENERATIVE CIRCUIT IN AN I.F. AMPLIFIER STAGE

Filed April 14, 1960

Inventor
Robert J. Orwin

Hofgren, Brady, Wegner, Allen & Stellman
Attorneys

United States Patent Office 3,107,333

Patented Oct. 15, 1963

3,107,333

REGENERATIVE CIRCUIT IN AN I.F. AMPLIFIER STAGE

Robert J. Orwin, La Grange Park, Ill., assignor to The Hallicrafters Co., a corporation of Delaware Filed Apr. 14, 1960, Ser. No. 22,169

4 Claims. (Cl. 330—112)

This invention relates to a regenerative circuit and more particularly to a regenerative circuit which utilizes the inherent interelectrode capacitance of an amplifying device.

The presence of oscillations caused by regenerative feedback in high gain amplifier circuits, as fixed tuned intermediate frequency amplifiers, is well-known, and while often undesirable, has been used in the past in various ways, as to provide a beat frequency oscillation in a carrier wave receiver. It is further known that a regenerative feedback increases the gain and selectivity of a circuit. The present invention is concerned with a novel circuit arrangement for providing a controlled regenerative feedback in a simple and economical manner.

One feature of the invention is the provision in an electronic circuit of a variable regeneration circuit, including an amplifying device having a control element and an output element with inherent capacity therebetween, and an adjustable control device connected with the amplifying device for varying the effect of the inherent capacity. Another feature is that the amplifying device includes a shield element between the control element and the output element and a variable impedance control device is connected with this shield element for varying the effect of the inherent capacity between the output element and the control element.

More specifically, in circuits utilizing an amplifying device having a control grid, an anode and a suppressor grid, with the control grids and anode circuits returned to a reference potential, a variable resistor is connected from the suppressor grid to the reference potential, in shunt with a portion of the inherent capacitance between the anode and control grid, and variation of the resistor effects a corresponding variation of the regenerative coupling between the anode and control grid.

Further features and advantages will readily be apparent from the following specification and from the drawings, in which.

Figures 1, 2:
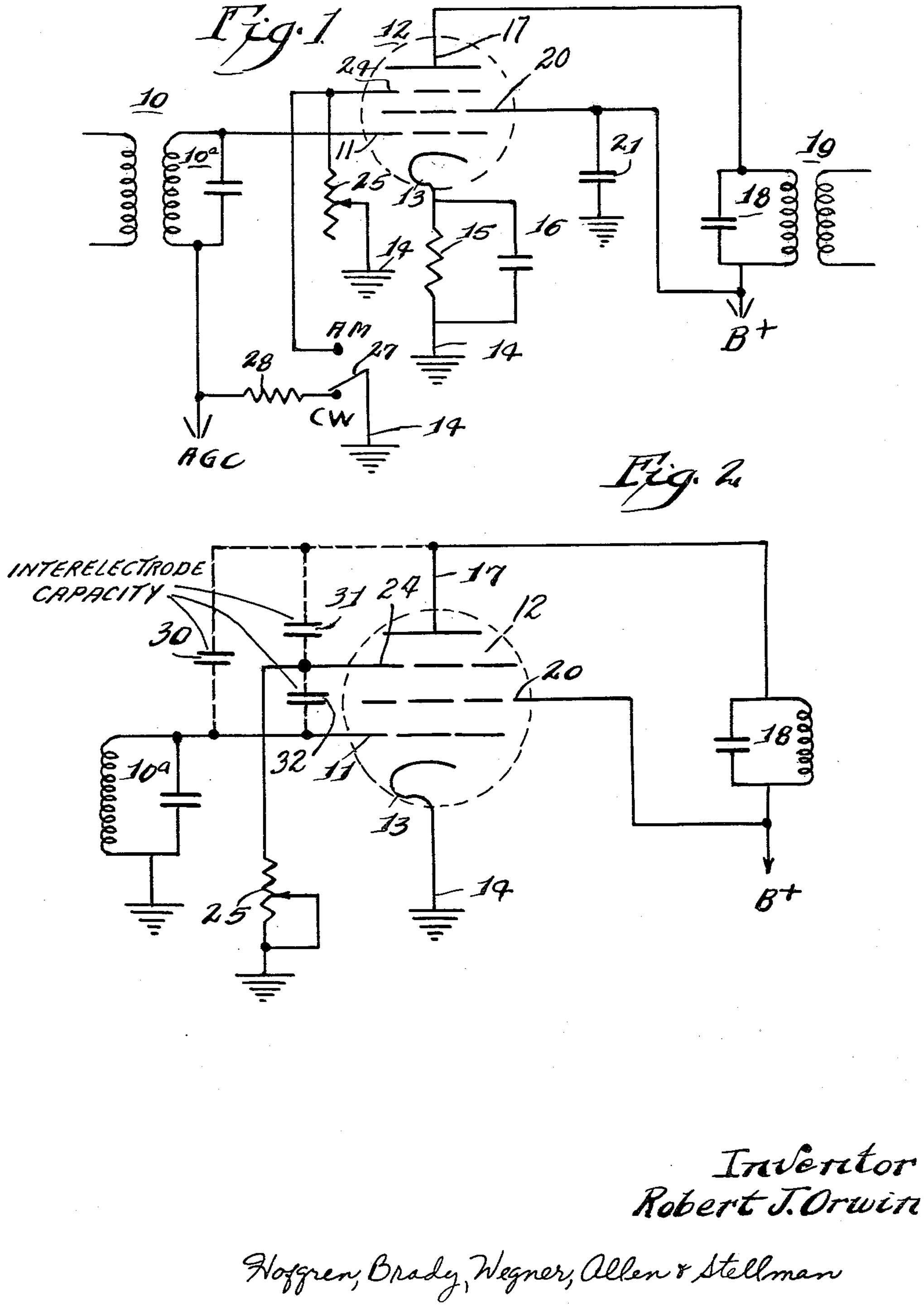
FIGURE 1 is a schematic diagram of a circuit embodying the invention.
FIGURE 2 is a schematic drawing showing pertinent portions of the equivalent circuit of FIGURE 1, used in an explanation of the operation of the invention.

As mentioned above, it has been known in the past that regeneration may be utilized in a tuned intermediate frequency amplifier circuit to provide a beat frequency oscillation for carrier wave reception. An example of such a circuit is found in Wilbur 2,556,993, which shows coupling provided between the plate circuit and the control grid circuit of an intermediate frequency amplifier by a length of insulated wire located adjacent the tube socket and capacitively coupled, by stray capacitance, to the anode and control grid circuits. When the wire is shorted to ground, it effectively grounds the stray capacitance and reduces the coupling between the plate and grid circuits. When the wire is removed from ground, however, it provides adequate coupling to sustain oscillation. This circuit operates satisfactorily in a receiver utilizing metal tubes which have a high stray capacitance and are at a relatively high impedance level. It has been found, however, that it is unsatisfactory in a receiver utilizing miniature tubes which have relatively low stray capacitance.

The present invention makes use of the interelectrode capacitance between the elements of an amplifying device or tube. It has been found that if the suppressor grid of the pentode intermediate frequency amplifier, which is usually returned directly to the cathode, is floating or unconnected, sufficient feedback is present from the anode to the control grid through the interelectrode capacitances of the tube to sustain oscillation, in receivers using both 455 kc. and 1650 kc. intermediate frequencies. However, this oscillation is not controlled and is undesirable from this standpoint as the beat frequency signal for a carrier wave receiver. In accordance with the present invention, as will be discussed in detail below, a variable control device, as a resistor, is connected from the suppressor grid to ground, providing a control over the regeneration of the circuit and thus of the beat frequency and the selectivity of the stage.

During the course of the following description, specific values and types will be designated for various circuit elements. It will be understood that this specific information is given primarily for the purpose of disclosing an operative embodiment of the invention and many changes and modifications will readily be apparent to those skilled in the art.

Turning now to the drawings, FIGURE 1 shows the invention as embodied in an intermediate frequency fixed tuned amplifier ($f$=455 kc.) having an input circuit coupled through transformer 10 with the output of the first detector stage or a preceding intermediate frequency amplifier of a radio receiver. The tuned secondary 10*a* of the coupling transformer is connected with the control grid 11 of a pentode amplifier tube 12, as a 12BA6, and is returned to a suitable source of automatic gain control potential, not shown. Cathode 13 of the amplifier is returned to a reference potential or ground 14 through bias resistor 15, 270 ohms, shunted by capacitor 16, 0.047 $\mu$f. The anode or plate 17 is connected through tuned circuit 18 with a suitable source of positive potential, not shown. The output of the stage is coupled through transformer 19 to succeeding circuits. The screen grid 20 of the amplifier tube is connected with the source of positive potential and bypassed to ground through capacitor 21, 0.005 $\mu$f.

In accordance with the invention, the suppressor grid 24, which forms a shield between control grid 11 and anode 17, has connected with it a variable resistor 25, 1500 ohms, which is returned to ground 14. The interposition of the resistance 25 in the circuit of the suppressor grid modifies the shielding effect of the suppressor grid in such a manner that the regeneration of the circuit increases as the value of the resistance of the circuit increases. With the maximum resistance in the circuit the amplifier acts much as if the suppressor were floating and the regeneration provided by the interelectrode capacitance coupling between the plate and control grid are adequate to sustain oscillation. As the value of the resistance in the suppressor circuit is decreased, the frequency of oscillation changes slightly and, at a critical point, the regenerative feedback becomes insufficient to sustain oscillation. This provides a second mode of operation in which the regeneration is utilized to increase the gain and selectivity of the amplifier, effectively increasing the Q of the amplifier.

Of course, the beat frequency oscillations and, in general, the increased selectivity, are desirable only with CW or carrier wave reception. Accordingly, when the amplifier is utilized in receiving an amplitude modulated wave, switch 27 is operated to connect the suppressor grid 24 to ground 14. In the CW position, the short across variable resistor 25 is removed and at the same time the tuned grid circuit 10*a* is returned to ground 14 through resistor 28, 470 ohms. This eliminates the effect of the automatic gain control potential which is generally masked or rendered inaccurate by the operation of the beat frequency oscillator.

In FIGURE 2 the inherent capacity between various of the elements pertinent to this invention, is shown. Again, the tuned input circuit 10a is connected with the control grid 11 of pentode amplifier 12. The cathode 13 is returned to ground 14, the anode 17 is connected through a tuned plate load circuit 18 with a source of positive potential to which the screen grid 20 is also connected. The interelectrode capacitances which are of interest in connection with this invention include the plate-to-control grid capacitance 30, the plate-to-suppressor grid capacitance 31 and the suppressor-grid to control-grid capacitance 32. The direct plate-to-control grid capacitance is extremely small, of the order of 0.0035 $\mu\mu$f., while the plate-to-suppressor and suppressor-to-control grid capacitances 31 and 32 are generally of the order of several micromicrofarads. With the suppressor grid grounded, only the direct plate-to-control grid capacitance is effective and it is not large enough to provide sufficient regenerative feedback to sustain oscillation at a practical frequency. The plate-to-suppressor and suppressor-to-control grid capacitances, being grounded at the suppressor, afford no coupling between the plate and control grid. However, if the suppressor is left floating, i.e. unconnected, capacitances 31 and 32 are effectively connected in series between the anode and control grid providing a relatively large amount of regenerative feedback. The variable resistor 25 connected with the suppressor grid affords a control of the regenerative feedback by varying the impedance level of the suppressor grid. As the value of the resistance increases, the regenerative coupling between the anode 17 and control grid 11 is increased.

In addition to providing a beat frequency oscillation and a gain and selectivity control as described above, the variable regeneration circuit may be utilized for the generation of a local carrier in receivers designed for reception of double sideband and single sideband transmission. It is important that the variable control element connected between the suppressor grid and ground may be a pure resistance as this eliminates a variation of the circuit operation with frequency.

While I have shown and described certain embodiments of my invention, it is to be understood that it is capable of many modifications. Changes therefore, in the construction and arrangement may be made without departing from the spirit and scope of the invention as disclosed in the appended claims.

I claim:

1. In a radio receiver having a tuned intermediate frequency amplifier section, a beat frequency oscillator of the character described, comprising: a pentode intermediate frequency amplifier having, in order, cathode, control grid, screen grid, suppressor grid and anode elements with inherent capacity between said elements; means providing a common reference potential; a source of positive operating potential having a negative terminal connected to said reference potential; an input coupling circuit connected between said control grid and said reference potential means, and tuned to the receiver intermediate frequency; an output coupling circuit connected between said anode element and the source of operating potential, and tuned to the receiver intermediate frequency; circuit means connecting said cathode element to said reference potential means; circuit means connecting said screen grid to said source of operating potential; and a direct coupled impedance circuit connected between said suppressor grid and said reference potential means, said impedance circuit being adjustable to vary the impedance level of said suppressor grid with respect to said reference potential at said receiver intermediate frequency, and to vary the effective inherent capacity between the said anode and control grid elements, providing a controlled regenerative feedback between said anode and control grid, said impedance circuit being free of connection with a voltage source.

2. The circuit of claim 1 wherein said impedance circuit includes a variable resistor connected between said suppressor grid and said reference potential means.

3. The circuit of claim 1 wherein said impedance circuit includes a control switch connected in parallel with an impedance element and actuatable between an amplitude modulation receiving position with the switch shorted across said element, and a carrier wave receiving position in which said suppressor grid is connected with said reference potential through said impedance element.

4. In a radio receiver having a tuned intermediate frequency amplifier section, a beat frequency oscillator of the character described, comprising: a pentode intermediate frequency amplifier having, in order, cathode, control grid, screen grid, suppressor grid and anode elements with inherent capacity between said elements; means providing a reference potential; a source of operating potential positive with respect to said reference potential; an input coupling circuit connected between said control grid and said reference potential means, and tuned to the receiver intermediate frequency; an output coupling circuit connected between said anode element and the source of operating potential, and tuned to the receiver intermediate frequency; means connecting said cathode element to said reference potential means; means connecting said screen grid to said source of operating potential; a suppressor grid circuit including a resistor connected from said suppressor grid to said reference potential means and adjustable to vary the impedance level of said suppressor grid, and the effective inherent capacity between said anode and control grid elements, providing controlled regenerative feedback from said anode to said control grid, said suppressor grid circuit being characterized by an absence of externally applied potential; a source of automatic gain control potential having a point of connection with said tuned input circuit; and a double throw switch with a movable contact connected with said reference potential means and having a carrier wave receiving position connecting said point of connection between said automatic gain control signal source and said tuned input circuit to said reference potential means, and an amplitude modulation receiving position connecting said suppressor grid with said reference potential means, said switch shorting across said resistor.

References Cited in the file of this patent

UNITED STATES PATENTS

| | | |
|---|---|---|
| 1,841,019 | Elliott | Jan. 12, 1932 |
| 1,853,106 | White | Apr. 12, 1932 |
| 2,230,996 | Barcus | Feb. 11, 1941 |
| 2,279,543 | Wheeler | Apr. 14, 1942 |
| 2,312,139 | Weagant | Feb. 23, 1943 |
| 2,556,993 | Wilbur | June 12, 1951 |
| 2,621,264 | Hultberg | Dec. 9, 1952 |
| 2,721,909 | Davies | Oct. 25, 1955 |

FOREIGN PATENTS

| | | |
|---|---|---|
| 166,024 | Switzerland | Mar. 1, 1934 |